US009164353B2

(12) United States Patent
Jeon et al.

(10) Patent No.: US 9,164,353 B2
(45) Date of Patent: Oct. 20, 2015

(54) QUANTUM ROD LIGHT-EMITTING DISPLAY DEVICE

(71) Applicant: LG DISPLAY CO., LTD., Seoul (KR)

(72) Inventors: Il Jeon, Seoul (KR); Kyung-Chan Kim, Paju-si (KR); Joong-Pill Park, Paju-si (KR); Moon-Bae Gee, Paju-si (KR); Sung-Hee Cho, Seoul (KR); Kyung-Kook Jang, Paju-si (KR); Kyung-Seok Jeong, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 81 days.

(21) Appl. No.: 13/651,023

(22) Filed: Oct. 12, 2012

(65) Prior Publication Data

US 2014/0016296 A1    Jan. 16, 2014

(30) Foreign Application Priority Data

Jul. 16, 2012 (KR) .......................... 10-2012-0077146

(51) Int. Cl.
*F21V 9/14* (2006.01)
*G02F 2/02* (2006.01)
(Continued)

(52) U.S. Cl.
CPC ........ *G02F 2/02* (2013.01); *H01L 33/06* (2013.01); *H01L 33/24* (2013.01)

(58) Field of Classification Search
CPC ......... G02F 1/01; G02F 1/13357; G02F 1/00; G02F 1/004; G02F 2/02; G02F 1/0045; H01L 33/06; H01L 33/24; B82Y 20/00; G02B 27/026
USPC ......... 257/13, E33.005, E33.008; 349/62, 65, 349/71; 362/19, 84, 9.71
See application file for complete search history.

(56) References Cited

U.S. PATENT DOCUMENTS 5,666,223 A * 9/1997 Bennett et al. ........... 359/487.04
7,015,266 B2   3/2006 Isozaki et al.
(Continued)

FOREIGN PATENT DOCUMENTS

| DE | 10314137 A1 | 10/2004 |
|---|---|---|
| JP | 9-127885 A | 5/1997 |
| WO | WO 2009/002512 A1 | 12/2008 |

OTHER PUBLICATIONS

Bruhn et al., "Controlled fabrication of individual silicon quantum rods yielding high intensity, polarized light emission," Nanotechnology, vol. 20, Nov. 19, 2009, 505301, pp. 1-5.

(Continued)

*Primary Examiner* — Mary McManmon
(74) *Attorney, Agent, or Firm* — Birch, Stewart, Kolasch & Birch, LLP

(57) ABSTRACT

A quantum rod light-emitting display device according to an embodiment of the invention includes a display panel including a first substrate, a second substrate opposite to the first substrate, and a quantum rod layer formed between the first substrate and the second substrate, wherein a plurality of quantum rods are arranged in the quantum rod layer in one direction; and a polarizer disposed on the display panel and including a quarter wave plate (QWP) layer and a polyvinyl alcohol (PVA) layer, wherein the PVA layer transmits only light linearly polarized in a first direction, and wherein the QWP layer is disposed under the PVA layer, and the QWP layer circularly polarizes the light linearly polarized in the first direction or linearly polarizes light reflected by the display panel in a second direction.

17 Claims, 7 Drawing Sheets

(51) Int. Cl.
*H01L 33/06* (2010.01)
*H01L 33/24* (2010.01)

(56) References Cited

U.S. PATENT DOCUMENTS

| | | | |
|---|---|---|---|
| 8,525,405 B2 * | 9/2013 | Kuwabara et al. | 313/506 |
| 2004/0241480 A1 * | 12/2004 | Fansler et al. | 428/515 |
| 2007/0024789 A1 * | 2/2007 | Itou et al. | 349/139 |
| 2009/0303421 A1 * | 12/2009 | Lee et al. | 349/96 |
| 2009/0321738 A1 | 12/2009 | Kim et al. | |
| 2010/0079704 A1 * | 4/2010 | Cho et al. | 349/71 |
| 2010/0208172 A1 * | 8/2010 | Jang et al. | 349/71 |
| 2010/0289001 A1 * | 11/2010 | Kahen et al. | 257/13 |
| 2011/0216271 A1 * | 9/2011 | Suzuki et al. | 349/71 |
| 2012/0075837 A1 * | 3/2012 | Um | 362/84 |
| 2013/0341588 A1 * | 12/2013 | Jeon et al. | 257/13 |

OTHER PUBLICATIONS

Hikmet et al., "Polarized-Light-Emitting Quantum-Rod Diodes," Adv. Mater., vol. 17, 2005, pp. 1436-1439.

* cited by examiner

BEFORE ELECTRIC FIELD IS APPLIED

AFTER ELECTRIC FIELD IS APPLIED

QUANTUM ROD LIGHT-EMITTING DISPLAY DEVICE

CROSS-REFERENCE TO RELATED APPLICATION

This application claims priority to and the benefit of Korean Patent Application No. 10-2012-0077146 filed in Republic of Korea on Jul. 16, 2012, the disclosure of which is hereby incorporated by reference in its entirety.

BACKGROUND OF THE INVENTION

1. Field of the Invention

Embodiments of the invention relate to a light-emitting display device, and more particularly, to a quantum rod light-emitting display device including a quantum rod layer.

2. Discussion of the Related Art

With gradual developments in personal computers (PCs), portable terminals, and various information apparatuses, highly efficient flat panel displays (FPDs) made lightweight and thin, and driven at low power have been required.

Recently, research into an active-matrix organic light emitting diode (AMOLED) panel, which is a self-emissive display panel, has briskly been conducted. In the AMOLED panel, organic emission materials forming an organic emission layer (EML) have greatly different lifespans according to color of light emitted by each of the organic emission materials. In particular, a blue emission material has a relatively short lifespan, which is shorter than a lifespan of a typical display device.

Accordingly, it is still necessary to develop an FPD that has high optical efficiency and as long a lifespan as a liquid crystal display (LCD), and which may be driven at low power.

Meanwhile, in an LCD, which is a typical FPD, light emitted by a backlight unit (BLU) is transmitted through a lower polarizer so that only light polarized in one direction can be incident to a liquid crystal (LC) panel. Thereafter, the light emitted by the BLU is transmitted through an upper polarizer and is finally incident to a user's eyes to display an image.

However, the LCD has a very low light use efficiency because only 5 to 6% of light emitted by the BLU is substantially and finally incident to a user's eyes. Also, since configuration of a polarizer becomes increasingly complicated to obtain desired polarization effects, fabrication cost increases.

To solve the above-described problems, a polarizer using a hydrophilic polymer has been adopted. In this instance, however, the polarizer absorbed moisture under high-temperature high-humidity conditions and generated gases in a solid to cause swelling of the solid. In serious instances, the polarizer contracted. As a result, failure rate of polarizer increased, thereby degrading the performance of the FPDs.

SUMMARY OF THE INVENTION

Accordingly, embodiments of the invention are directed to a display device that substantially obviates one or more of the problems due to limitations and disadvantages of the related art.

An object of the embodiments of the invention is to provide a display device that may be configured more simply than a conventional liquid crystal display (LCD) and have excellent polarization characteristics.

Another object of the embodiments of the invention is to provide a display device that may improve transmittance of a polarizer and improve field visibility.

Additional features and advantages of the embodiments of the invention will be set forth in the description which follows, and in part will be apparent from the description, or may be learned by practice of the embodiments of the invention. The objectives and other advantages of the embodiments of the invention will be realized and attained by the structure particularly pointed out in the written description and claims hereof as well as the appended drawings.

To achieve these and other advantages and in accordance with the purpose of the invention, as embodied and broadly described herein, a quantum rod light-emitting display device includes a display panel including a first substrate, a second substrate opposite to the first substrate, and a quantum rod layer formed between the first substrate and the second substrate, wherein quantum rods in the quantum rod layer are arranged in one direction; and a polarizer disposed on the display panel and including a quarter wave plate (QWP) layer and a polyvinyl alcohol (PVA) layer expressed by Formula 1, wherein the PVA layer transmits only light linearly polarized in a first direction, and wherein the QWP layer is disposed under the PVA layer, and the QWP layer circularly polarizes the light linearly polarized in the first direction or linearly polarizes light reflected by the display panel in a second direction.

In another aspect, a quantum rod light-emitting display device includes: a display panel including a quantum rod layer in which a plurality of quantum rods are arranged in one direction; a polarizer disposed on the display panel and including a QWP layer, a PVA layer, and a TAC layer are sequentially stacked; and a backlight unit disposed under the display panel.

The PVA layer includes a material expressed by Formula 1, $$\left(-CH_2-CH\atop\vert\atop OH\right)_m \left(-CH_2-CH\atop\vert\atop X\right)_l, \qquad \text{[Formula 1]}$$

wherein X denotes polyethylene, and each of m and l is an integer ranging from 1 to 10000.

It is to be understood that both the foregoing general description and the following detailed description are by example and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to the embodiments of the invention, examples of which are illustrated in the accompanying drawings.

To begin with, a quantum rod used in the embodiments of the invention will be briefly described.

Figure 1:
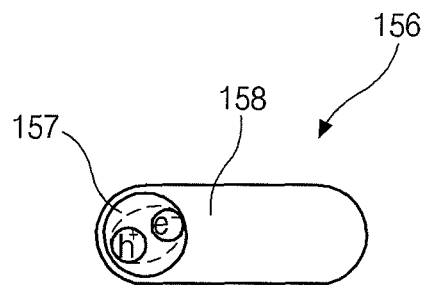
FIG. 1 illustrates a quantum rod according to an embodiment of the invention.

FIG. 1 illustrates a quantum rod according to an embodiment of the invention.

As shown in FIG. 1, a quantum rod 156 includes a core 157 forming a center portion of the quantum rod 156, and a shell 158 surrounding the core 157.

In an example embodiment of the invention, although the quantum rod 156 of FIG. 1 includes the core 157 and the shell 158 surrounding the core 157, the shell 158 may be omitted and the quantum rod 156 may include only the core 157.

Although FIG. 1 illustrates that the core 157 of the quantum rod 156 has a spherical shape, the core 157 may have any one of a spherical shape, an elliptical spherical shape, a polyhedral shape, and a rod shape. Other shapes may be used for the core 157. When the quantum rod 156 includes only the core 157 without the shell 158, the core 157 may have an elliptical spherical shape or a rod shape.

When the quantum rod 156 includes the core 157 and the shell 158 surrounding the core 157, the core 157 may have any one of a spherical shape, an elliptical spherical shape, a polyhedral shape, and a rod shape. Other shapes may be used for the shell 158. The shell 158 surrounding the core 157 may have a major axis and a minor axis. A cross-section in a direction of a minor axis of the quantum rod 156 may have any one of a circular shape, an elliptical shape, and a polyhedral shape. Other shapes may be used for the cross section of the shell 158.

The shell 158 may have a single layer structure or a multilayered structure and be formed of one of an alloy, an oxide-based material, and a doped material or a mixture of at least two thereof.

In this instance, a ratio of the major axis of the shell 158 to the minor axis thereof may be in a range from 1:1.1 to 1:30.

Meanwhile, the core 157 of the quantum rod 156 may be formed of Group II-VI, III-V, III-VI, VI-IV, or IV semiconductor materials of the periodic table, alloys thereof, or mixtures thereof.

That is, when the core 157 of the quantum rod 156 is formed of Group II-VI elements, the core 157 of the quantum rod 156 may be formed of one of cadmium selenide (CdSe), cadmium sulfide (CdS), cadmium telluride (CdTe), zinc oxide (ZnO), zinc selenide (ZnSe), zinc sulfide (ZnS), zinc telluride (ZnTe), mercury selenide (HgSe), mercury telluride (HgTe), and cadmium zinc selenide (CdZnSe), or a mixture of at least two thereof.

In addition, when the core 157 of the quantum rod 156 is formed of Group III-V elements, the core 157 of the quantum rod 156 may be formed of one of indium phosphide (InP), indium nitride (InN), gallium nitride (GaN), indium antimony (InSb), indium arsenic phosphide (InAsP), indium gallium arsenide (InGaAs), gallium arsenide (GaAs), gallium phosphide (GaP), gallium antimony (GaSb), aluminum phosphide (AlP), aluminum nitride (AlN), aluminum arsenide (AlAs), aluminum antimony (AlSb), cadmium selenium telluride (CdSeTe), and zinc cadmium selenide (ZnCdSe), or a mixture of at least two thereof.

Furthermore, when the core 157 of the quantum rod 156 is formed of Group VI-IV elements, the core 157 of the quantum rod 156 may be formed of one of lead selenide (PbSe), lead telluride (PbTe), lead sulfide (PbS), lead tin telluride (PbSnTe), and thallium tin telluride ($Tl_2SnTe_5$), or a mixture of at least two thereof.

In the quantum rod 156 formed of the above-described materials, a ratio of the major axis to the minor axis ranges from about 1:1.1 to about 1:30. Even if the quantum rod 156 includes the core 157 formed of the same material, a wavelength of light fluoresced by the quantum rod 156 may vary according to the size of the core 157. That is, light having a shorter wavelength fluoresces with a reduction in the size (or diameter) of the core 157, while light having a longer wavelength fluoresces with an increase in the size (or diameter) of the core 157.

Accordingly, the quantum rods 156 according to the embodiment of the invention may control the size (or diameter) of the core 157 and provide light in almost all desired colors in the visible light range.

Figure 2:
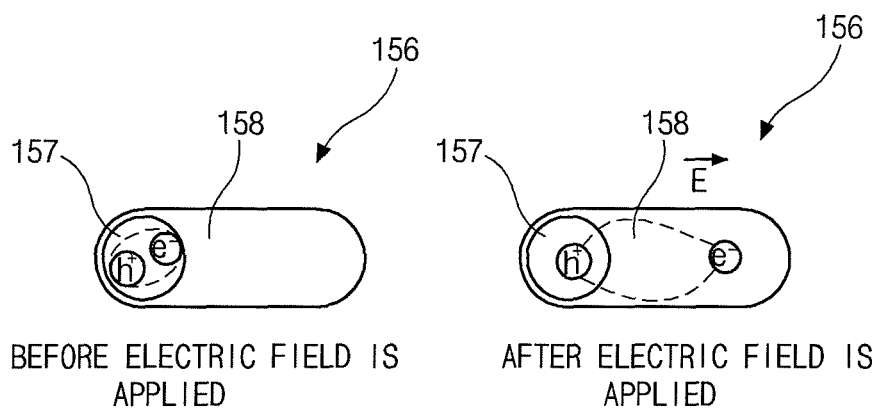
FIG. 2 illustrates states of electrons and holes before (electric field off state) and after (electric field on state) an electric field is applied to a quantum rod according to an embodiment of the invention.

FIG. 2 illustrates states of electrons and holes before (electric-field off state) and after (electric-field on state) an electric field is applied to a quantum rod according to an embodiment of the invention.

In the embodiment of the invention shown in FIG. 2, the shell 158 surrounding the core 157 has a major axis and a minor axis. In embodiments of the invention, the core 157 itself may have a major axis and a minor axis.

In this instance, before an electric field is applied in the direction of the major axis of the shell 158 or the core 157, electrons combine with holes in the core 157. However, once an electric field is applied in the direction of the major axis of the shell 158 or the core 157, electrons "e" are spatially separated from holes "h" within the core 157 or between the core 157 and the shell 158 to cause separation of bandgaps.

Thus, the intensity of an electric field may be controlled by adjusting an amount of fluorescent light generated by the quantum rod 156, thereby providing a gray level.

Accordingly, since the quantum rod 156 according to the embodiment of the invention has a quantum yield of 100% in theory, the quantum rod 156 may generate fluorescent light at high intensity.

Hereinafter, a polarizer of a quantum rod light-emitting display device according to an embodiment of the invention will be described in detail.

Figure 3:
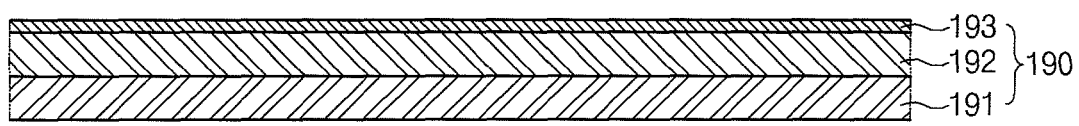
FIG. 3 is a cross-sectional view of a structure of a polarizer according to an embodiment of the invention.

Initially, FIG. 3 is a cross-sectional view of a structure of a polarizer according to an embodiment of the invention.

Referring to FIG. 3, a polarizer 190 is shown, which may be disposed on a display panel (or a quantum rod panel) 102. The polarizer 190 includes a quarter wave plate (QWP) layer 191 and a polyvinyl alcohol (PVA) layer 192 disposed on the QWP layer 191. The polarizer 190 further includes a triacetyl cellulose (TAC) layer 193 disposed on the PVA layer 192. The PVA layer 192 may be expressed by Formula 1.

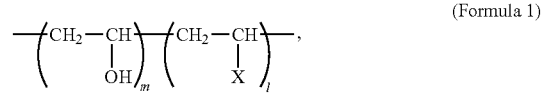

(Formula 1)

wherein X denotes polyethylene, and each of m and l is an integer ranging from 1 to 10000. In embodiments of the invention, a ratio of m to 1 (i.e., m:l) may be 10000:1 to 1:10000.

In this instance, the QWP layer 191 generates a retardation difference of λ/4 with respect to linearly polarized light to provide a circularly polarized light.

The PVA layer 192 is formed by adsorbing iodine (I) molecules having dichroism or dichroic dyes on a film including a material expressed by the Formula 1, and stretching the film to arrange the I molecules or dichroic dyes parallel to a stretched direction. In this instance, although a stretch ratio preferably ranges from 600% to 1000%, the stretch ratio may be appropriately controlled within such a range as to attain the objects of the embodiments of the invention. Thus, the PVA layer 192 has an absorption axis in the stretched direction and a transmission axis in a direction perpendicular to the absorption axis. That is, light incident to the PVA layer 192 is linearly polarized according to a component parallel to the transmission axis of the PVA layer 192.

In addition, the TAC layer 193 is a typical retardation-free protection film configured to protect the PVA layer 192. Although a protection film formed of tri-acetyl cellulose is used as the TAC layer 193 in the embodiment of the invention, the embodiments of the invention are not limited thereto. Also, after a protection film formed of TAC is formed, a surface treatment process, such as a hard coating process or a low-reflection treatment, may be further performed to improve resistance to discoloring and to enhance field visibility.

Figure 4:
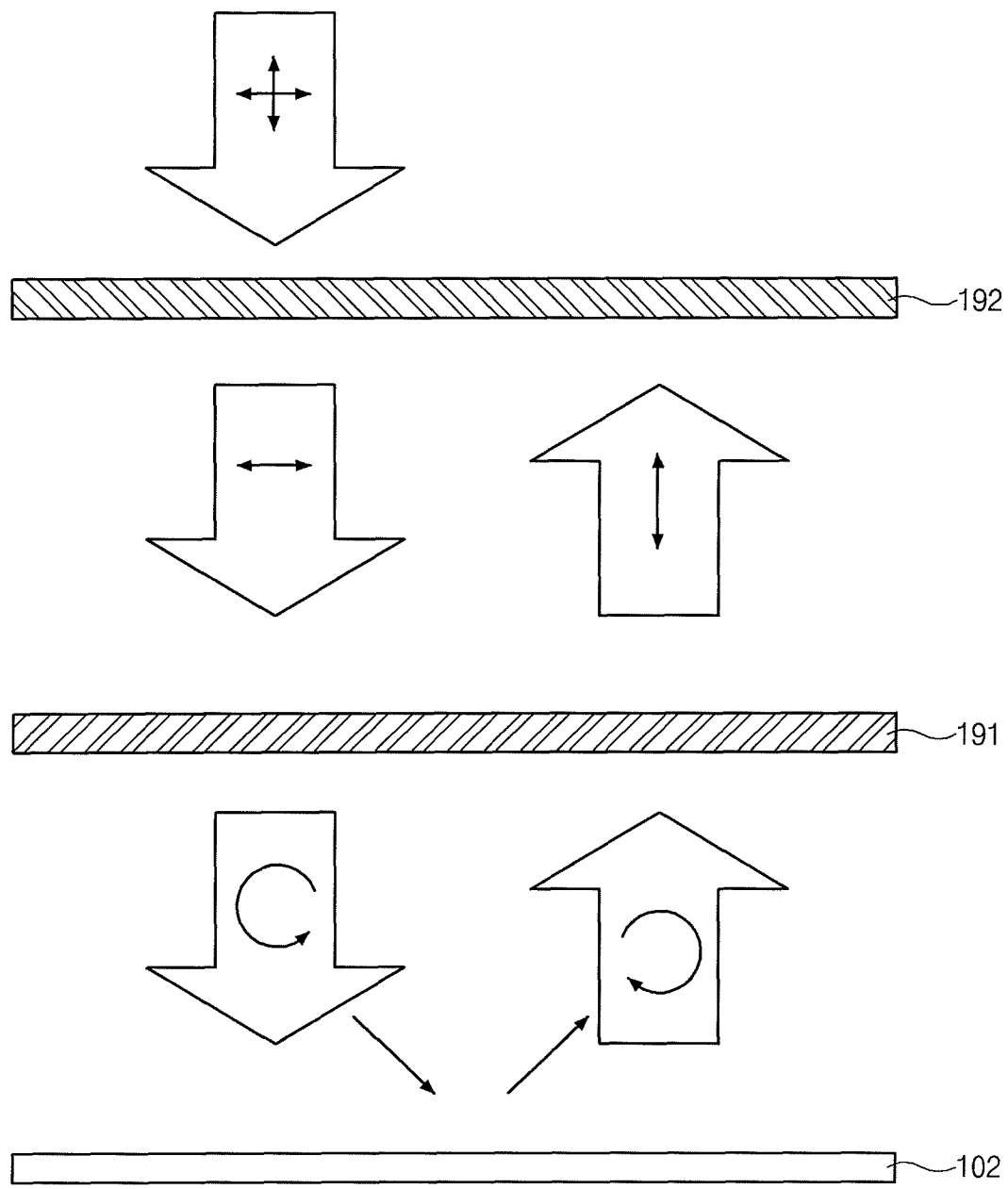
FIG. 4 illustrates the principle of a polarizer according to an embodiment of the invention.

FIG. 4 illustrates the principle of a polarizer according to an embodiment of the invention.

Referring to FIG. 4, externally incident unpolarized light is transmitted through the PVA layer 192 and the QWP layer 191 based on the following principles.

Initially, the PVA layer 192 transmits only light linearly polarized in a first direction among the unpolarized light, while the QWP layer 191 circularly polarizes the light linearly polarized in the first direction.

Thereafter, the circularly polarized light is reflected by the quantum rod panel 102 according to the embodiment of the invention and is transmitted again through the QWP layer 191. In this instance, after the circularly polarized light is transmitted through the QWP layer 191, a direction of the transmitted light is changed when reflected by the quantum rod panel 102.

Also, the QWP layer 191 linearly polarizes the circularly polarized light in a second direction. In this instance, since the PVA layer 192 transmits only the light linearly polarized in the first direction, the light linearly polarized in the second direction is not transmitted through the PVA layer 192.

Although FIG. 4 illustrates by example that the PVA layer 192 transmits only light linearly polarized in a horizontal direction, the embodiments of the invention are not limited thereto, and various directions may be applied. For example, the PVA layer 192 may transmit only light linearly polarized in a vertical direction. Also, although it is illustrated by example that the QWP layer 191 left-circularly polarizes light, the embodiments of the invention are not limited thereto, and various directions may be applied. For example, the QWP layer 191 may right-circularly polarize light. Accordingly, the externally incident unpolarized light is extinguished as it passes through the polarizer 190 and reflects off a surface of the quantum rod panel 102.

Figure 5:
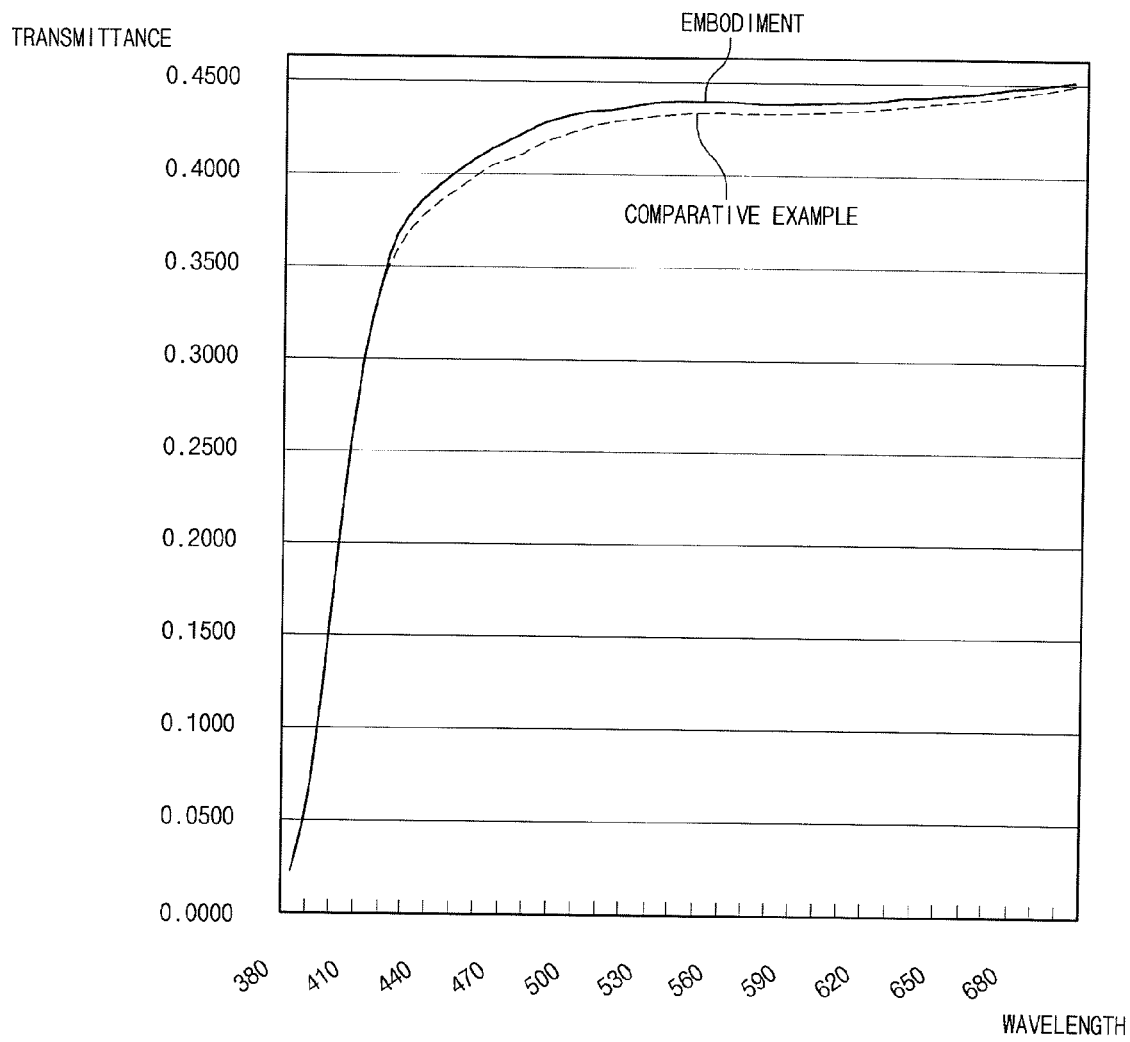
FIG. 5 illustrates a comparison of transmittance between polarizers according to a comparative example and an embodiment of the invention.

FIG. 5 is a graph showing a comparison of transmittance between a conventional polarizer and a polarizer according to an embodiment of the invention.

Referring to FIG. 5, polarization characteristics of a polarizer according to an embodiment of the invention and a conventional polarizer were obtained.

It was confirmed that a polarizer of the embodiment of the invention including a PVA layer expressed by Formula 1 had a transmittance about 1.2% higher than that of a polarizer of a comparative example including a conventional PVA layer. In particular, it was confirmed that parallel transmittance, which is a transmittance of light having only a parallel horizontal component, could be improved. As a result, it was confirmed that the polarizer according to the embodiment of the invention was effective in improving transmittance of a quantum rod light-emitting display device according to the embodiment of the invention.

In the embodiments of the invention, hydroxyl groups (OH groups) of a conventional PVA layer are replaced with polyethylene to increase a stretch ratio of the PVA layer and improve alignment of iodine molecules. Thus, polarization efficiency may be enhanced.

Hereafter, a quantum rod light-emitting display device according to the embodiment of the invention, which includes quantum rods having the above-described characteristics and which serves as a display device, will be described.

Figure 6:
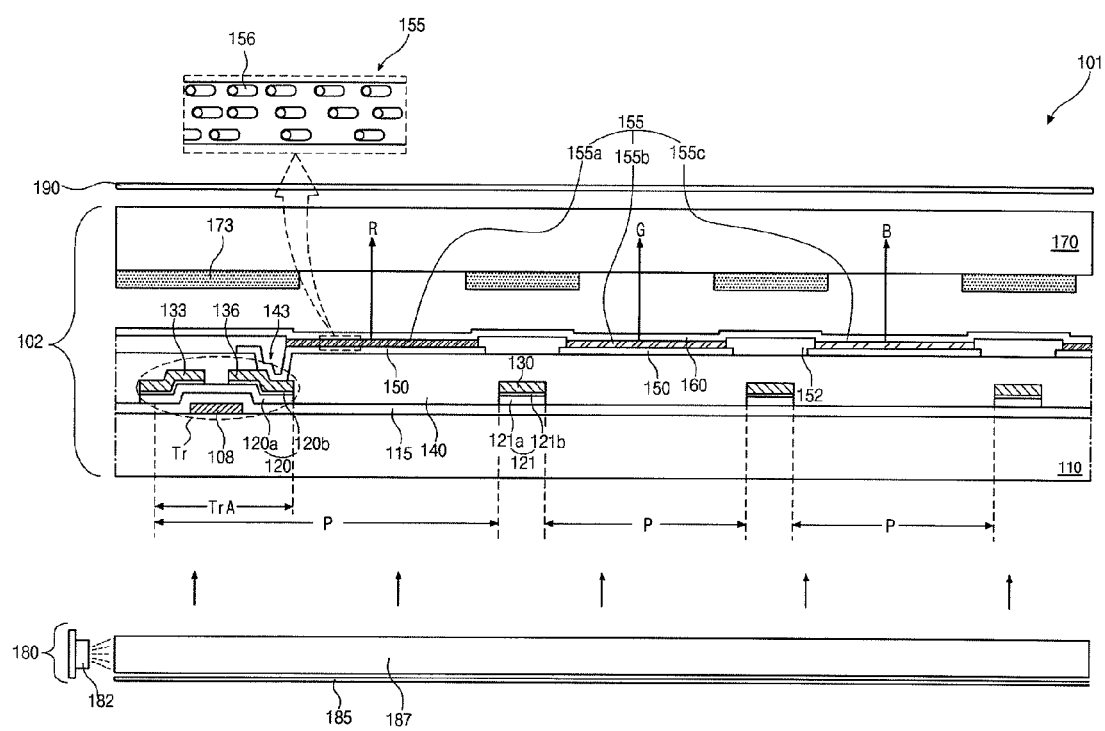
FIG. 6 is a cross-sectional view of a quantum rod light-emitting display device according to an embodiment of the invention.

FIG. 6 is a cross-sectional view of a quantum rod light-emitting display device according to an embodiment of the invention.

Figure 7A:
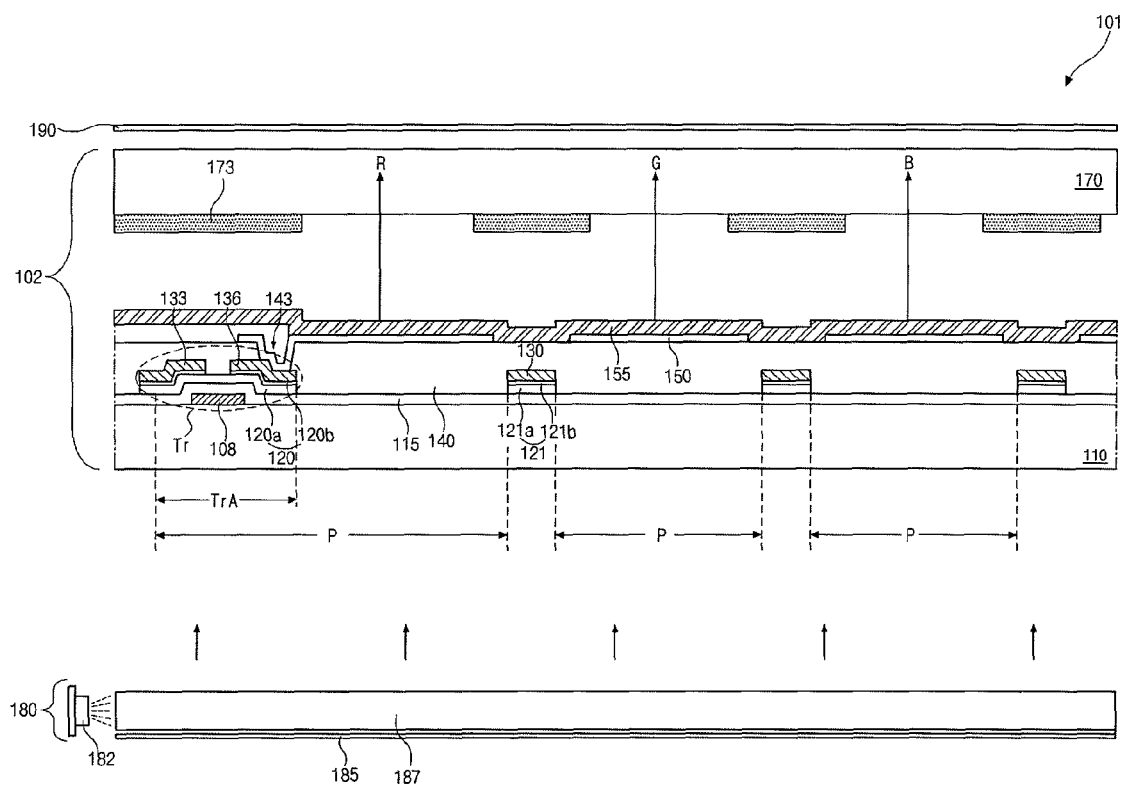
FIGS. 7A and 7B are cross-sectional views of quantum rod light-emitting display devices according to other embodiments of the invention.
Figure 7B:
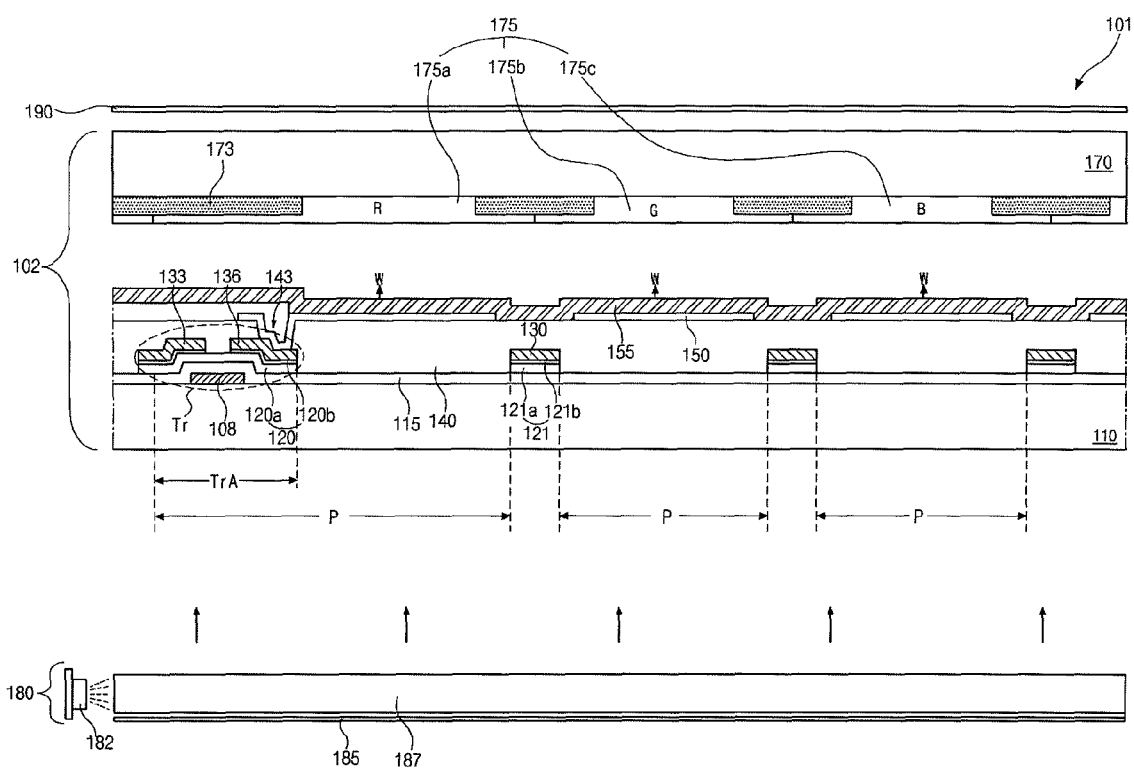
Figure 7C:
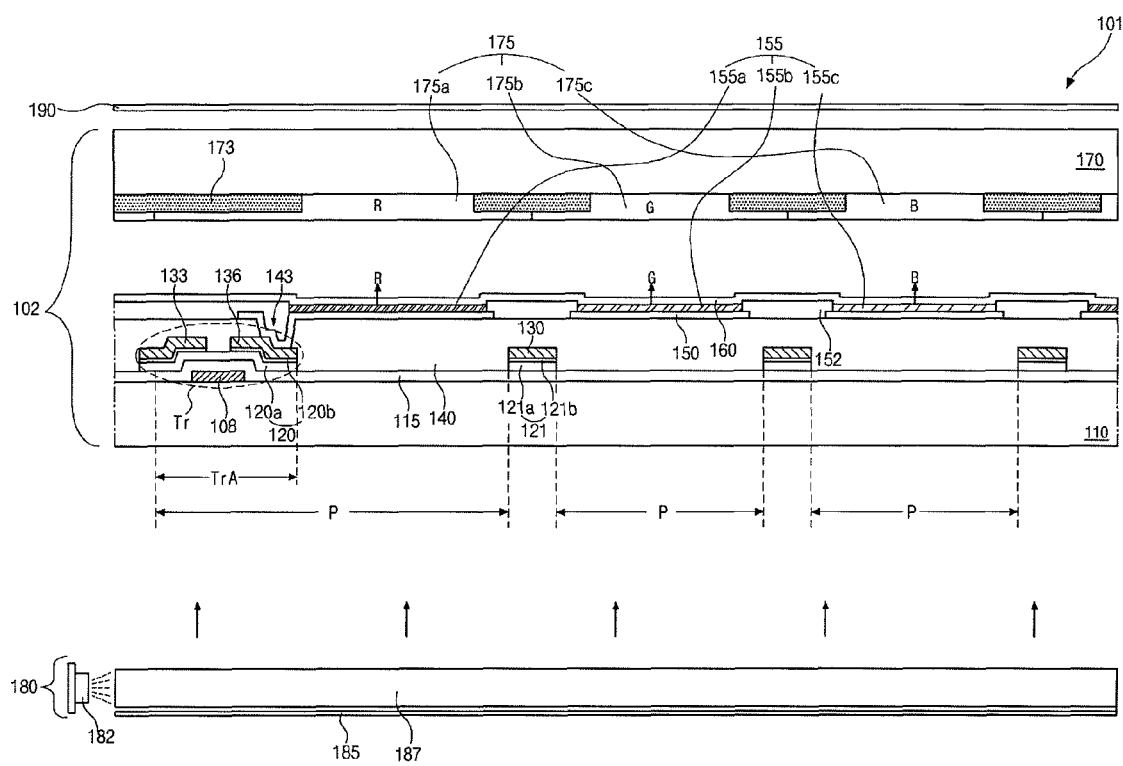
FIG. 7C is a cross-sectional view of a quantum rod light-emitting display device according to another embodiment of the invention.

FIGS. 7A and 7B are cross-sectional views of quantum rod light-emitting display devices according to other embodiments of the invention, and FIG. 7C is a cross-sectional view of a quantum rod light-emitting display device according to another embodiment of the invention.

To begin with, FIG. 6 illustrates three adjacent pixel regions P, and a thin film transistor (TFT) Tr is illustrated in only one of the pixel regions P for brevity. Also, a region including the TFT Tr in each of the pixel regions P is defined as a switching region TrA.

Referring to FIG. 6, a quantum rod light-emitting display device 101 according to an embodiment of the invention includes a quantum rod panel 102, which includes a first electrode 150 divided into the respective pixel regions P, a second electrode 160 formed on the entire surface of a display region configured to display an image, a first substrate 110 including a quantum rod layer 155 interposed between the first and second electrodes 150 and 160, a second substrate 170 disposed opposite the first substrate 110; a BLU 180; and a polarizer 190.

In this instance, the polarizer 190, which has the most characteristic configuration of the invention, includes a QWP layer 191, a PVA layer 192 expressed by Formula 1, and a TAC layer 193. The polarizer 190 includes the PVA layer 192, which linearly polarizes externally incident unpolarized light in a first direction and transmits only light linearly polarized in the first direction, and the QWP layer 191, which is disposed under the PVA layer 192 and circularly polarizes the light linearly polarized in the first direction or linearly polarizes the circularly polarized light in a second direction.

Meanwhile, in the quantum rod light-emitting display device 101 according to the embodiment of the invention, light emitted by the BLU 180 is absorbed by the quantum rod layer 155 so that electrons and holes can recombine to generate fluorescent light. Accordingly, light from the BLU 180 is used to generate light in the quantum rod layer 155. In this instance, a wavelength of the light from the BLU 180 is equal to or less than a wavelength of the fluorescent light from the quantum rod layer 155.

As described above, the quantum rod layer 155 is able to generate differently an intensity of an electric field when a voltage is applied to the first and second electrodes 150 and 160 respectively disposed under and on the quantum rod layer 155. Thus, the display device 101 displays a gray level by controlling a rate of recombination of electrons and holes in a plurality of quantum rods included in the quantum rod layer 155. Also, quantum rods 156 of the quantum rod layer 155 are formed to different sizes in the respective pixel regions P to generate red (R), green (G), and blue (B) light. Thus, the display device 101 may provide a full color range and display full-color images.

Hereinafter, construction of the first substrate 110 including the first and second electrodes 150 and 160 and the quantum rod layer 155 will be described.

Initially, the first substrate 110 is a transparent insulating substrate, for example, a substrate formed of a transparent glass material or a flexible plastic substrate.

A gate line is formed on the first substrate 110 and extends in a first direction. The gate line is formed of a metal having a low resistance, for example, one selected from aluminum (Al), an Al alloy (e.g., aluminum neodymium (AlNd)), copper (Cu), a Cu alloy, molybdenum (Mo), and a Mo alloy (e.g., molybdenum titanium (MoTi)), or at least two materials thereof. Also, a gate electrode 108 is formed in the switching region TrA of each of the pixel regions P and connected to the gate line.

A gate insulating layer 115 is formed on the entire surface of the first substrate 110 including the gate line and the gate electrode 108. The gate insulating layer 115 is formed of an inorganic insulating material, for example, silicon oxide ($SiO_2$) or silicon nitride ($SiN_x$).

A semiconductor layer 120 is formed on the switching region TrA disposed on the gate insulating layer 115 in a position corresponding to the gate electrode 108. The semiconductor layer 120 includes an active layer 120a formed of intrinsic amorphous silicon, and ohmic contact layers 120b of impurity-doped amorphous silicon disposed on the active layer 120a and—spaced apart from each other. Source and drain electrodes 133 and 136 are formed apart from each other on the semiconductor layer 120 and contact the ohmic contact layers 120b, respectively.

In this instance, the active layer 120a is exposed between the source and drain electrodes 133 and 136 spaced apart from each other.

Thus, the gate electrode 108, the gate insulating layer 115, the semiconductor layer 120, and the source and drain electrodes 133 and 136, which are sequentially stacked on the switching region TrA, constitute a TFT Tr.

A data line 130 is formed on the gate insulating layer 115 and crosses the gate line to define a pixel region P. The data line 130 extends in a second direction and is connected to the source electrode 133 of the TFT Tr.

In this instance, although it is illustrated by example in terms of a fabrication process that a dummy pattern 121 including first and second semiconductor patterns 121a and 121b is formed of the same material as the active layer 120a and the ohmic contact layers 120b under the data line 130, but in other embodiments of the invention, the dummy pattern 121 may be omitted.

Meanwhile, although it is illustrated by example that the TFT Tr is a bottom-gate-type transistor including the semiconductor layer 120 having the active layer 120a and the ohmic contact layers 120b formed of amorphous silicon and the gate electrode 108 disposed in the lowest position in other embodiments of the invention, the TFT Tr may be a top-gate-type transistor including a semiconductor layer formed of polysilicon (poly-Si) and having a structure formed by sequentially stacking the poly-Si semiconductor layer, a gate insulating layer, a gate electrode, an interlayer insulating layer, and source and drain electrodes spaced apart from each other in contact with the poly-Si semiconductor layer. When a top-gate-type TFT is included, a gate line is provided on a gate insulating layer having a gate electrode, and a data line may be provided on an interlayer insulating layer.

A protection layer 140 having an even surface is formed on the data line 130 and the source and drain electrodes 133 and 136. In this instance, a drain contact hole 143 is formed in the protection layer 140 to expose the drain electrode 136 of the TFT Tr in each of the pixel regions P.

First electrodes 150 are formed of a transparent conductive material on the protection layer 140. Each of the first electrodes 150 is in contact with the drain electrode 136 of the TFT Tr through the drain contact hole 143 in the corresponding one of the pixel regions P.

Buffer patterns 152 are formed on the first electrodes 150 and the protection layer 140 exposed between the first electrodes 150 to correspond to interfaces (i.e., the gate line and the data line 130) between the respective pixel regions P and overlap edges of the first electrodes 150.

The quantum rod layer 155 including a plurality of quantum rods 156 is formed on the first electrode 150 in each of the pixel regions P surrounded with the buffer pattern 152. The quantum rod layer 155 may include quantum rods (refer to 156 in FIG. 1) having cores (refer to 157 in FIG. 1) with different sizes in the respective pixel regions P configured to emit red, green, and blue light. Alternatively, the quantum rod layer 155 may include quantum rods (refer to 156 in FIG. 1) having cores (refer to 157 in FIG. 1) with the same size.

In this instance, the plurality of quantum rods 156 included in the quantum rod layer 155 have major axes arranged in one direction on the entire surface of the display region of the first substrate 110. Various alignment methods may be used to align the quantum rods 156 in one direction in the quantum rod layer 155. For example, the quantum rods 156 may be aligned in one direction in the quantum rod layer 155 using any one of a voltage application method, an alignment method using an alignment film, an alignment method using a self-aligned monomer, and an alignment method using reactive mesogens. Furthermore, the alignment of the quantum rods 156 in one direction is not limited to the above-described alignment methods but may be performed using other various alignment methods.

A degree of the alignment of the major axes of the quantum rods 156 in one direction, that is, an alignment level, may be obtained by measuring a polarization ratio. After light polarized in a specific direction, for example, in a horizontal or vertical direction, is irradiated toward the quantum rod layer 155, the amount of light that has passed through an analyzer is measured to obtain a degree of polarization of the quantum rod layer 155.

Assuming that the amount of light emitted by a light source is I, light having only a horizontal component parallel to an imaginary reference line disposed parallel to the quantum rod layer 155 and extending in one direction is Ih, and light having only a vertical component normal to the reference line is Iv, when directionality is not typically given to the major axes of the quantum rods 156, that is, when an alignment process is not performed, a polarization ratio PR is defined as follows:

$$PR=(Ih-Iv)/(Ih+Iv).$$

In addition, when the quantum rods 156 of the quantum rod layer 155 are arranged in one direction, that is, in a horizontal direction or vertical direction, due to an alignment process, horizontal and vertical polarization ratios PRh and PRv are defined as follows:

$$PRh=Ih/(Ih+Iv), \text{and}$$

$$PRv=Iv/(Ih+Iv).$$

Accordingly, the alignment of the plurality of quantum rods 156 in one direction in the quantum rod layer 155 indicates that the horizontal polarization ratio PRh or the vertical polarization ratio PRv is greater than 0.5 and less than 1. That is, an inequality: 0.5<PRh or PRv<1 is satisfied.

As described above, when the quantum rods (refer to 156 in FIG. 1) having the cores (refer to 157 in FIG. 1) with different sizes are provided in the respective pixel regions P configured to emit red, green, and blue light, the wavelength of light fluoresced by the quantum rods 156 varies according to the size of the cores 157. That is, the quantum rods 156 generate fluorescent light having a shorter wavelength with a reduction in the size of the cores 157, and generate fluorescent light having a longer wavelength with an increase in the size of the cores 157.

Meanwhile, referring to FIGS. 7A and 7B, the quantum rod layer 155 is formed on the entire surface of the display region including a plurality of pixel regions P, and the buffer patterns 152 provided at the interfaces between the respective pixel regions P are omitted. That is, although FIG. 6 illustrates by example that the quantum rod layer 155 is divided into the respective pixel regions P, the embodiment of the invention may be modified into various other embodiments of the invention.

A second substrate 170 is formed to correspond to the first substrate 110. Like the first substrate 110, the second substrate 170 may be a transparent insulating substrate formed of a glass material or a plastic material having flexibility. Alternatively, the second substrate 170 may be a sheet or film formed of a polymer.

A black matrix 173 is formed on an inner side surface of the second substrate 170 to correspond to the interfaces between the pixel regions P and the switching regions TrA in which the TFTs are formed. In other embodiments (refer to FIGS. 7A and 7B) of the invention in which the quantum rod layer 155 is formed on the entire surface of the display region, the black matrix 173 should be formed to reduce or prevent light leakage and a mixture of colors among respective pixels. However, in other embodiments of the invention (refer to FIG. 6 and FIG. 7C) in which the quantum rod layer 155 is divided into the respective pixel regions P, the black matrix 173 may be omitted.

As shown in FIG. 7C, the quantum rods (refer to 156 in FIG. 1) having the cores (refer to 157 in FIG. 1) with the same size are formed in the respective pixel regions P in the quantum rod layer 155. Also, to provide a full color range, red, green, and blue color filter patterns 175*a*, 175*b*, and 175*c* of a color filter layer 175 are sequentially and repetitively formed in three adjacent pixel regions P to correspond to regions surrounded with the black matrix 173. Although FIG. 6 illustrates that only the black matrix 173 is provided on the inner side surface of the second substrate 170, the embodiment of the invention may be modified into various other embodiments of the invention. Also, although the color filter layer 175 is shown as having red, green, and blue color filter patterns 175*a*, 175*b*, and 175*c*, in embodiments of the invention, one or more of the red, green, and blue color filter patterns 175*a*, 175*b*, and 175*c* may be omitted. For example, when the BLU 180 emits blue light, the blue color filter patterns 175*c* may be omitted.

An overcoat layer may be provided on the entire surface of the second substrate 170 over the black matrix 173 and the color filter layer 175. When the quantum rod layer 155 provided on the first substrate 110 includes the quantum rods (refer to 156 in FIG. 1) having the cores (refer to 157 in FIG. 1) with different sizes in the respective pixel regions P configured to emit red, green, and blue light, a color filter layer including red, green, and blue color filter patterns disposed in the respective pixel regions P may be further provided on the second substrate 170 to obtain a wide color reproduction range.

Meanwhile, a BLU 180 configured to supply light to the quantum rod layer 155 is formed under the quantum rod panel 102, that is, on an outer side surface of the first substrate 110. The BLU 180 includes a light source 182, a reflection plate 185, and a light guide plate (LGP) 187 mounted on the reflection plate 185.

In embodiments of the invention, the light source 182 generates light having a short wavelength range of less than about 450 nm, for example, blue visible light or UV light. That is, the light source 182 may include one selected from a fluorescent lamp including a cold cathode fluorescent lamp (CCFL) and an external electrode fluorescent lamp (EEFL) or a light emitting diode (LED). Although embodiments of the invention are illustrated as having the light source 182 include an LED, the embodiments of the invention are not limited thereto.

The light source 182 is disposed on one side of the LGP 187 opposite (or facing) a light incidence portion of the LGP 187. The LGP 187 totally reflects light incident from the light source 182 internally several times so that the light travels and uniformly spreads onto a surface of the LGP 187. Thus, the LGP 187 provides a surface light source to the quantum rod panel 102. In this instance, a pattern having a specific shape may be disposed on a rear surface of the LGP 187 to supply a uniform surface light source to the quantum rod panel 102. In this instance, the pattern having the specific shape may be variously configured with an elliptical pattern, a polygonal pattern, or a hologram pattern, to guide incident light into the LGP 187. Other patterns may also be used. The pattern may be formed on a bottom surface of the LGP 187 using a printing technique or an injection technique.

The reflection plate 185 is disposed on a rear surface of the LGP 187 and reflects light transmitted through the rear surface of the LGP 187 towards the quantum rod panel 102 to improve luminance.

Although the embodiments of the invention illustrate that the BLU 180 having the above-described construction is an edge-type BLU in which the light source 182 is provided on a side surface of the LGP 187, and the LGP 187 allows surface light to be incident to the quantum rod panel 102, the BLU 180 may be a direct-type BLU.

In a direct-type BLU, a plurality of fluorescent lamps serving as light sources are disposed over a reflection plate at regular intervals, or an LED driver substrate having a plurality of LEDs is provided. Also, a diffusion plate may be provided instead of the LGP 187 over the fluorescent lamps or the LED driver substrate.

According to embodiments of the invention, a quantum rod light-emitting display device can have a simpler configuration, consume less power, and exhibit higher luminance and transmittance than an LCD requiring an additional color filter layer.

Furthermore, although quantum rods having cores with only different sizes are provided to display red, green, and blue colors, a quantum rod light-emitting display device according to embodiments of the invention have no significant differences among materials, as compared with an organic light emitting diode (OLED) adopting materials having different physical properties to display red, green, and blue light. Also, the quantum rod light-emitting display device has a long lifespan because the display device maintains fluorescence for a longer duration of time than when a self-emissive material is used.

According to embodiments of the invention, a quantum rod light-emitting display device adopts a polarizer including a PVA layer formed of a hydrophobic material to increase transmittance of the polarizer and improve field visibility. Therefore, efficiency of light emitted by a BLU can be maximized.

It will be apparent to those skilled in the art that various modifications and variations can be made in a display device of the invention without departing from the sprit or scope of the invention. Thus, it is intended that embodiments of the invention cover the modifications and variations of this invention provided they come within the scope of the appended claims and their equivalents.

What is claimed is:

1. A quantum rod light-emitting display device comprising:
   a display panel including a first substrate, a second substrate opposite to the first substrate, and a quantum rod layer formed between the first substrate and the second substrate and containing quantum rods, wherein the quantum rods in the quantum rod layer are arranged in one direction; and
   a polarizer disposed on the display panel at the first substrate and including a quarter wave plate (QWP) layer and a polyvinyl alcohol (PVA) layer, the PVA layer includes a material expressed by Formula 1, and the PVA layer formed on the QWP layer,

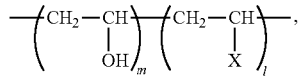

[Formula 1]

wherein X denotes polyethylene, and each of m and l is an integer ranging from 1 to 10000,
wherein the PVA layer transmits external light linearly polarized in a first direction, and
wherein the QWP layer is disposed under the PVA layer so that the QWP layer is disposed closer to the first substrate than the PVA layer, and the QWP layer circularly polarizes the light linearly polarized in the first direction and linearly polarizes light reflected by the display panel in a second direction so that the external light is extinguished by the polarizer after being reflected by the display panel.

2. The quantum rod light-emitting display device of claim 1, further comprising a backlight unit provided under the display panel and providing light to the display panel.

3. The quantum rod light-emitting display device of claim 2, wherein the quantum rod layer receives the light from the backlight unit and outputs visible light.

4. The quantum rod light-emitting display device of claim 3, wherein the visible light is one of white light, red light, green light and blue light.

5. The quantum rod light-emitting display device of claim 2, wherein the light from the backlight unit is one of ultraviolet (UV) light and blue light.

6. The quantum rod light-emitting display device of claim 2, wherein the quantum rod layer receives the light from the backlight unit and outputs visible light of different colors depending on different sizes of the quantum rods.

7. The quantum rod light-emitting display device of claim 2, wherein externally incident unpolarized light is extinguished when passing through the polarizer and reflecting off a surface of the display panel.

8. The quantum rod light-emitting display device of claim 1, further comprising a plurality of pixel regions formed on the first substrate, and each pixel region having a thin film transistor (TFT), wherein portions of the quantum rod layer are locally formed over the plurality of pixel regions, respectively.

9. The quantum rod light-emitting display device of claim 1, wherein each quantum rod includes a core, or a core and a shell.

10. The quantum rod light-emitting display device of claim 1, further comprising:
    a plurality of first electrodes locally formed on the first substrate;
    a buffer pattern locally formed between adjacent first electrodes; and
    a second electrode formed on the plurality of first electrodes and on the buffer pattern,
    wherein the quantum rod layer is disposed locally between the plurality of first electrodes and the second electrode.

11. The quantum rod light-emitting display device of claim 1, further comprising:
    a pattern layer formed on the first substrate; and
    a plurality of first electrodes locally formed on the pattern layer, and exposing portions of the pattern layer,
    wherein the quantum rod layer is disposed on the plurality of first electrodes and on the exposed portions of the pattern layer.

12. The quantum rod light-emitting display device of claim 1, further comprising a black matrix patterned on the second substrate.

13. The quantum rod light-emitting display device of claim 12, further comprising a color filter layer formed on the second substrate, and including red, green, and blue color filter patterns.

14. The quantum rod light-emitting display device of claim 1, wherein the polarizer further includes a triacetyl cellulose (TAC) layer formed on the PVA layer.

15. A quantum rod light-emitting display device comprising:
    a display panel including a quantum rod layer in which a plurality of quantum rods are arranged in one direction;
    a polarizer disposed on the display panel and including a quarter wave plate (QWP) layer, a polyvinyl alcohol (PVA) layer, and a triacetyl cellulose (TAC) layer sequentially stacked, and the QWP layer disposed closer to the display panel than the PVA layer; and
    a backlight unit disposed under the display panel,
    wherein the PVA layer includes a material expressed by Formula 1:

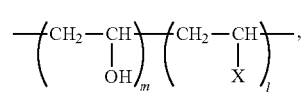

[Formula 1]

wherein X denotes polyethylene, and each of m and l is an integer ranging from 1 to 10000.

16. The quantum rod light-emitting display device of claim 1, wherein the second substrate is closer than the first substrate to an incident surface of the external light for the quantum rod light-emitting display device, and
    wherein the QWP layer contacts the second substrate.

17. The quantum rod light-emitting display device of claim 15, wherein the display panel includes a first substrate and a second substrate having the quantum rod layer interposed therebetween,
    wherein the second substrate is closer than the first substrate to an incident surface of an external light for the quantum rod light-emitting display device, and
    wherein the QWP layer contacts the second substrate.

\* \* \* \* \*